United States Patent
Vathulya

(10) Patent No.: US 6,747,531 B2
(45) Date of Patent: Jun. 8, 2004

(54) CIRCUIT AND METHOD FOR INPUT SIDE IMPEDANCE MATCHING OF A POWER AMPLIFIER IN AN ELECTRONIC DEVICE

(75) Inventor: Vickram R. Vathulya, Croton-On-Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 09/811,647

(22) Filed: Mar. 19, 2001

(65) Prior Publication Data

US 2002/0163407 A1 Nov. 7, 2002

(51) Int. Cl.$^7$ .......................... H03H 11/10; H03H 7/38
(52) U.S. Cl. .......................... 333/217; 333/32; 330/303
(58) Field of Search ................... 333/213, 216, 333/217, 32; 330/303

(56) References Cited

U.S. PATENT DOCUMENTS 4,180,786 A * 12/1979 Forward et al. ........ 333/217 X
5,343,172 A * 8/1994 Utsu et al. .............. 333/217 X

FOREIGN PATENT DOCUMENTS

WO    WO 98/47190 A1 * 10/1998 ........... H01L/79/78

* cited by examiner

*Primary Examiner*—Robert Pascal
*Assistant Examiner*—Stephen E. Jones
(74) *Attorney, Agent, or Firm*—Aaron Waxler

(57) ABSTRACT

A circuit and method for input side impedance matching of a power amplifier in an electronic device. Specifically, the present invention provides an impedance transformer network that includes a negative resistor in series with a bondwire inductor. The network is placed in parallel with a signal source and synthesizes the source side impedance at the input of the power amplifier. The desired impedance is synthesized by selecting an appropriate value for the negative resistor and setting the reactance of the inductor equal to the capacitance of the electronic device at a required frequency of operation.

20 Claims, 7 Drawing Sheets

CIRCUIT AND METHOD FOR INPUT SIDE IMPEDANCE MATCHING OF A POWER AMPLIFIER IN AN ELECTRONIC DEVICE

BACKGROUND OF THE INVENTION

1. Technical Field

The present invention generally relates to a circuit and method for input side impedance matching of a power amplifier in an electronic device. In particular, the present invention relates to an impedance transformer network for synthesizing impedance at an input of the power amplifier.

2. Background Art

In the area of Radio-Frequency (RF) circuit design, the need to achieve an impedance match at the load and source ends of the circuit is great. The failure to achieve an impedance match is especially problematic in the design of electronic equipment (e.g. audio, wireless communications, etc.), where un-matched impedances can substantially reduce sound quality. Such impedance matching is traditionally accomplished by transforming either the load end impedance or the source end impedance to match the other.

To date, various transforming networks have been implemented for achieving transformation in an RF circuit. Typically, such systems utilize capacitors, inductors, and resistors along with transmission lines to achieve the intended matching. One example of such a system is an LC match comprised of an inductor "L" and capacitor "C." However, when used for input side matching of a power amplifier, the LC match often results in a reduced signal swing (i.e., reduced ratio of signal voltage at the amplifier input to signal voltage at the signal source).

In order to overcome the reduce signal swing problem, some circuits are designed with an additional input stage pre-driver(s) to size down and achieve the required input impedance. This is often the case with CMOS based circuits where adequate input drive signal is important. However, the use of additional stages implies more interstage matching, which has an impact on design reliability and cycle time.

In view of the foregoing, there exists a need for an improved circuit and method for input side impedance of a power amplifier in an RF circuit (e.g., that is implemented in an electronic device). In addition, there exists a need for such a circuit to include an impedance transformer network for synthesizing the source side impedance at the amplifier input. There also exists a need for such a circuit and method to increase signal swing without requiring additional stages (e.g., pre-drivers).

SUMMARY OF THE INVENTION

The present invention overcomes the drawbacks of existing systems by providing a circuit and method for input side impedance matching of a power amplifier in an electronic device. In particular, the present invention includes an impedance transformer network that comprises a negative resistor in series with an inductor for synthesizing the source side impedance at the input side of the power amplifier.

According to a first aspect of the present invention, a circuit for input side impedance matching of a power amplifier in an electronic device is provided. The circuit comprises: (1) a source for providing a signal, wherein the signal has a predetermined impedance; and (2) an impedance transformer network joined in parallel with the source, wherein the network comprises a negative resistor in series with an inductor, and wherein the network synthesizes the predetermined impedance at an input of the power amplifier.

According to a second aspect of the present invention, a circuit for input side impedance matching of a power amplifier in an electronic device is provided. The circuit comprises: (1) a source for providing a signal, wherein the signal has a predetermined impedance; (2) an impedance transformer network joined in parallel with the source, wherein the network comprises a negative resistor in series with an inductor; and (3) wherein a value of the negative resistor is selected to synthesize the predetermined impedance at an input of the power amplifier, and wherein the inductor has a reactance equal to a capacitance of the device at a required frequency of operation.

According to a third aspect of the present invention, a method for matching impedance at an input of a power amplifier in an electronic device is provided. The method comprises the steps of: (1) providing a signal from a source, wherein the provided signal has a predetermined impedance; (2) joining an impedance transformer network in parallel with the source, wherein the network comprises a negative resistor in series with an inductor; and (3) selecting a value for the negative resistor so that the predetermined impedance is synthesized at the input of the power amplifier.

Therefore, the present invention provides a circuit and method for input side impedance matching of a power amplifier in an electronic device. The present invention reduces the problems associated with unmatched impedances and reduced signal swing.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
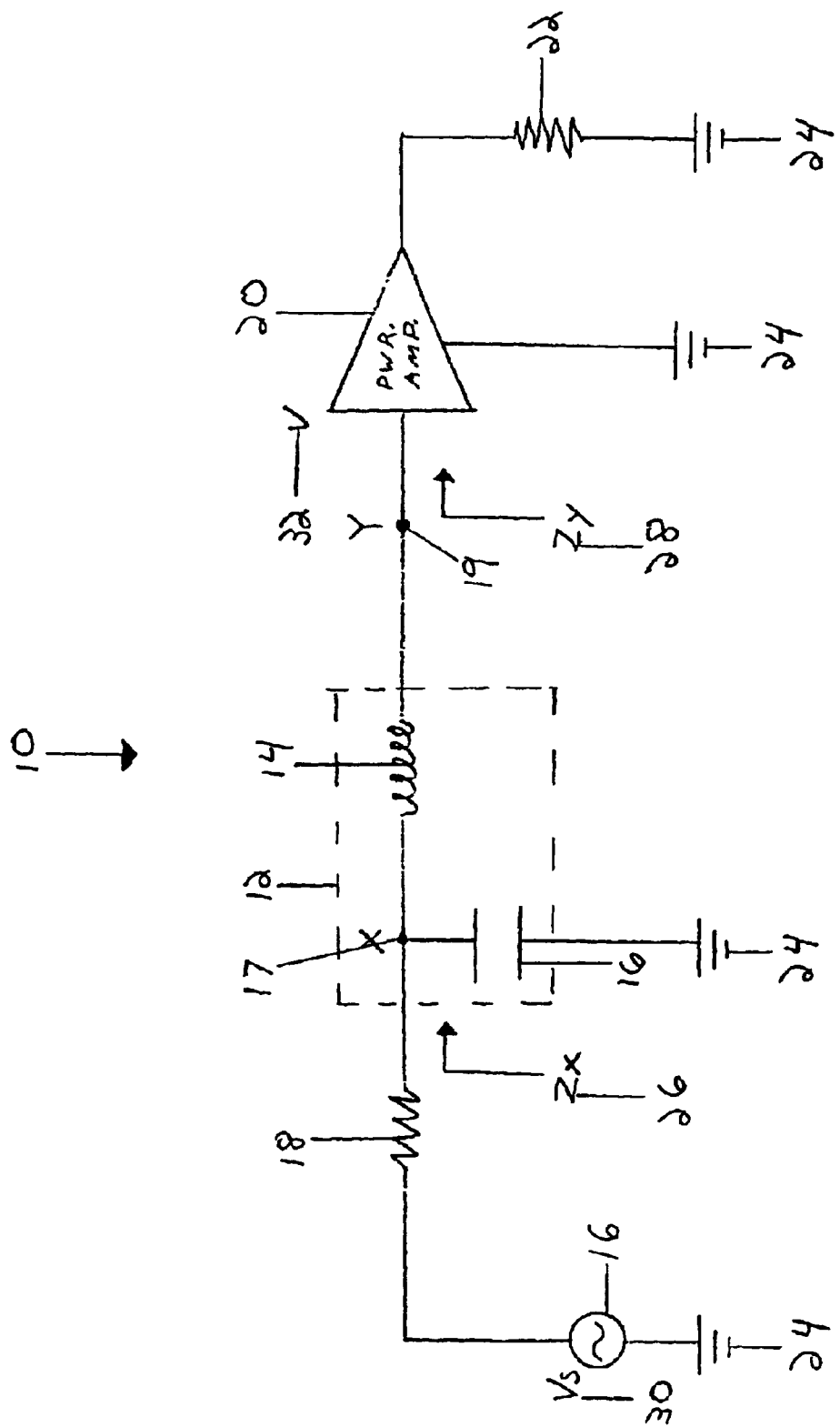
FIG. 1 depicts an LC match in a circuit.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

Referring now to FIG. 1, a circuit 10 having an LC match 12 is depicted. Circuit 10 is preferably a Radio-Frequency (RF) circuit for an electronic device (e.g., audio equipment) and generally includes signal source 16, resistor 18, power amplifier 20, load resistor 22, and grounds 24. LC match 12 generally includes inductor 14, and capacitor 16. It should be understood that although circuit 10 is described as being an RF circuit, other circuit types could be implemented.

Moreover, it should be understood that the components depicted are not intended to be limiting and circuit 10 could include additional resistors, capacitors, power amplifiers, etc.

As indicated above, it is important for source side impedance Zx 26 to match the input (load) side impedance Zy 28 (i.e., at input 19 of power amplifier 20). For example, if source side impedance Zx 26 is 50 Ohms, input side impedance Zy 28 should also be approximately 50 Ohms. The failure to match the impedances could result in substandard performance of the circuit. LC match 12 functions to match the input side impedance Zy 28 to the source side impedance Zx 26. However, in implementing LC match 12, signal swing (i.e., the ratio of signal voltage at the input Vi 32 to the signal voltage at the source Vs 30) is reduced. In typical circuits utilizing the LC match 12 depicted, a signal swing less than 0.5 is often obtained.

Specifically, if circuit 10 transforms input impedance Zy 28 to the source impedance Zx 26, the voltage at point X 17 will be approximately one half (0.5) of the source voltage Vs 30. Moreover, since the LC network is lossless and the magnitude of input impedance Zy 28 will most likely be smaller than resistance 18, input voltage Vi 32 will be even less than voltage at point X 17 (power conservation) resulting in a reduced voltage swing at the driving node for power amplifier 20.

As used herein, input side is meant to refer to the input of the power amplifier. However, it is understood that other terminology could be used. For example the input could be referred to as the load side or gate/base of the power amplifier transistor (not shown).

Figure 2:
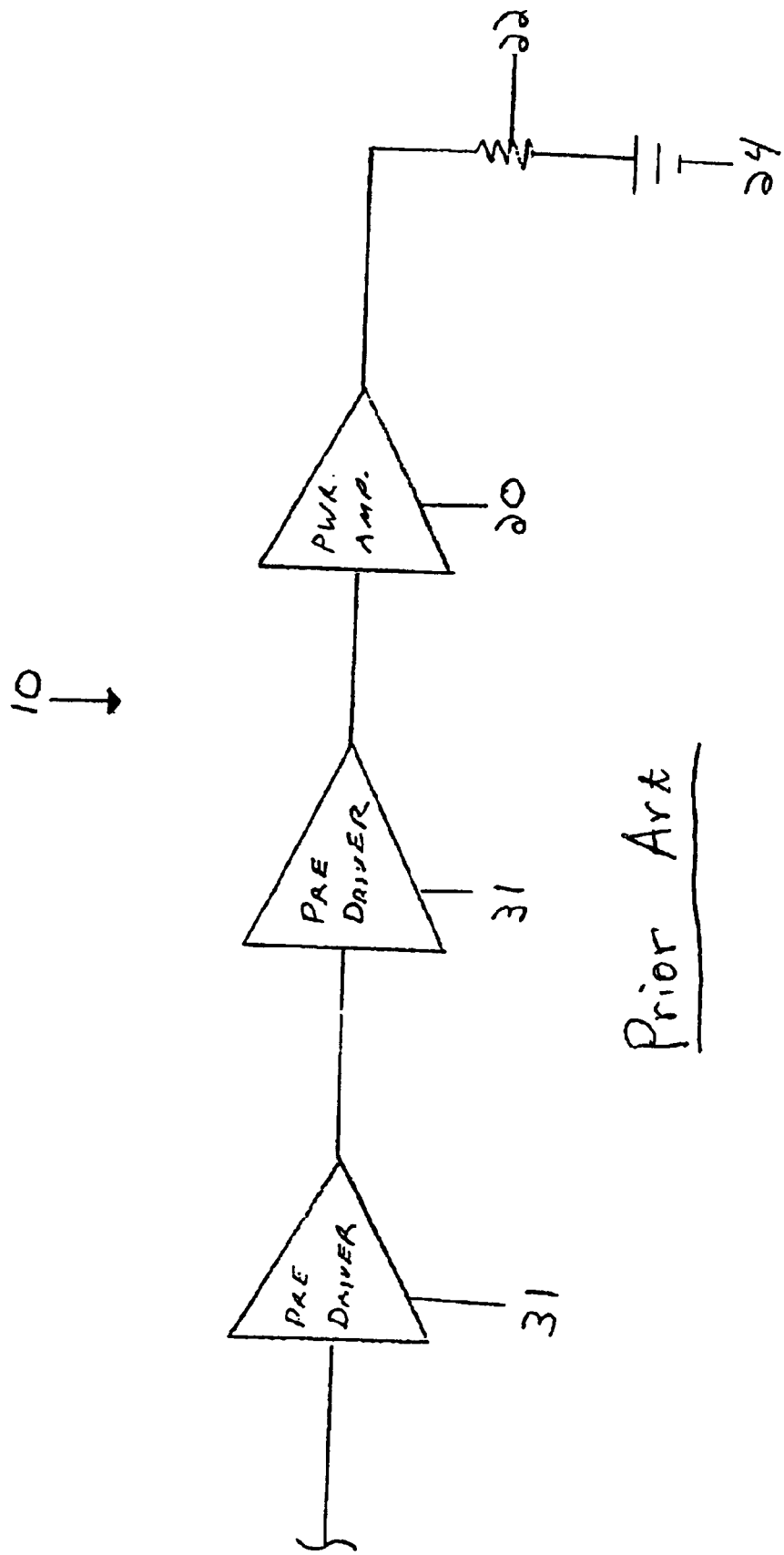
FIG. 2 depicts a power amplifier with pre-drivers.

To correct problems associated with reduced signal swing, one or more pre drivers 31 could be added to circuit 10 to drive the signal voltage at the input of the amplifier 20 (as shown in FIG. 2). However, as indicated above, the use of additional stages, such as pre drivers 31, implies additional interstage matching (i.e., between pre drivers 31 and power amplifier 20). With such interstage matching, reliability and cycle time of the circuit design are impacted. Moreover, three stage designs, such as that shown in FIG. 2, are more susceptible to oscillations as compared to two stage designs.

Figure 3:
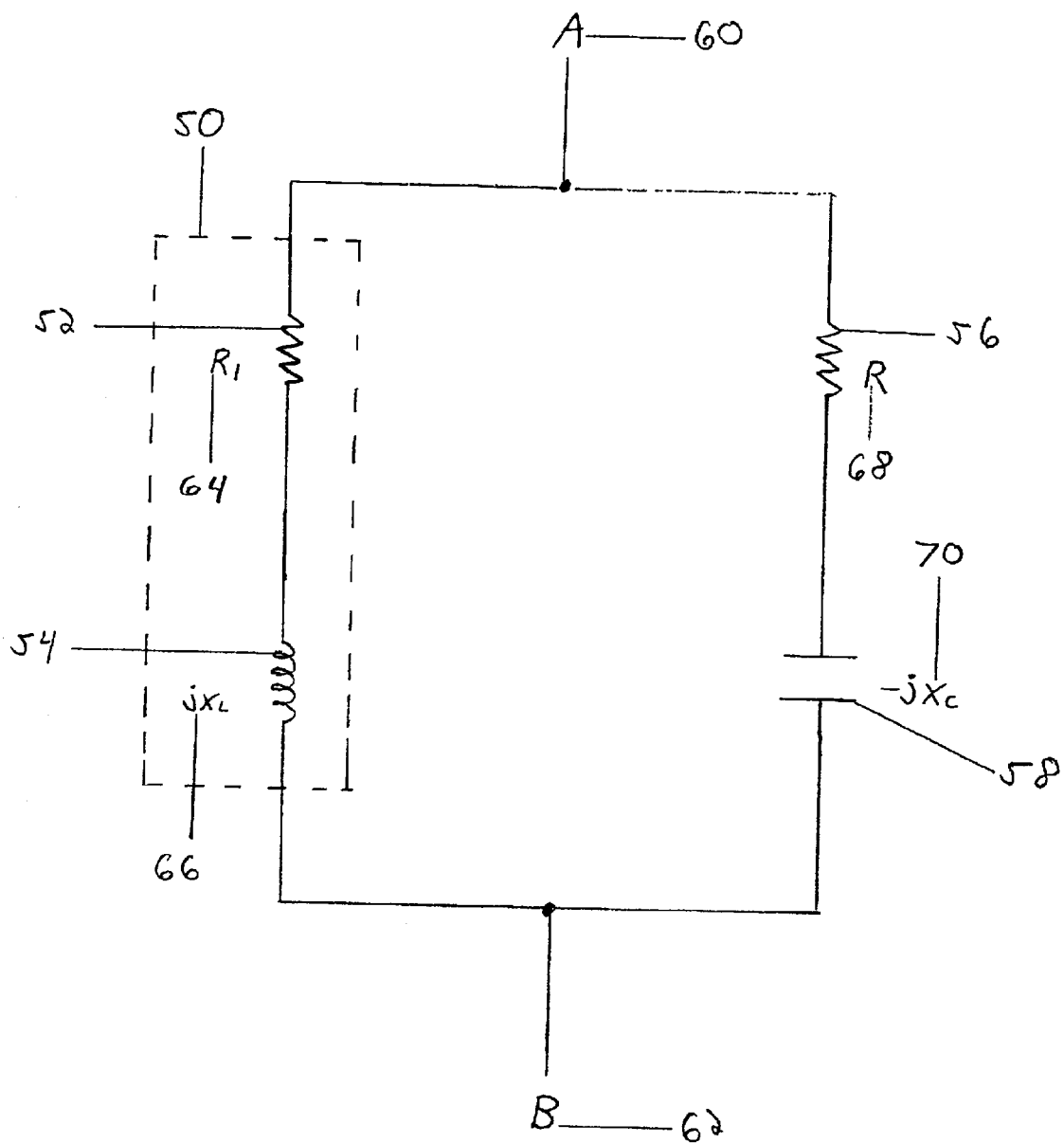
FIG. 3 depicts an impedance transformer network in accordance with the present invention.

Referring now to FIG. 3, an impedance transformer network 50 in accordance with the present invention is shown. Impedance transformer network 50 generally comprises a negative resistor 52 in series with an inductor 54. Negative resistors, such as that shown in FIG. 3, are well known to those of ordinary skill in the art. Generally, negative resistance is where an increase in current is accompanied by a decrease in voltage over the working range. Inductor 54 is preferably a bondwire inductor.

In most cases, impedance at the input side of a power amplifier can be modeled as a resistor 56 having a value R 68 in series with a capacitor 58 having a capacitance—jXc 70. As will be described in further detail below, impedance transformer network 50 matches the input side impedance by "synthesizing" the source side impedance. This is generally accomplished by choosing a proper value R1 64 for negative resistor 52 (described in further detail below) and then setting inductor reactance 66 equal to the capacitance 70 of the electronic device at a required frequency of operation. Using this technique, any impedance can be synthesized across nodes A 60 and B 62.

Specifically, transformation occurs according to the following equations:

I.

$$MAG[Zeff] = \frac{[(R1R + X^2)^2 + X^2(R - R1)^2]^{1/2}}{ABS[R + R1]}$$

Where MAG[Zeff] is the magnitude of effective impedance synthesized at the input side (i.e., across nodes A 60 and B 62), R1 is the value of negative resistor 64, R is the value of resistor 68, and X is the capacitance 70 of the electronic device at a required frequency of operation and the inductor reactance 66 as well.

II.

$$Re[Zeff] = \frac{RR1 + X^2}{R + R1}$$

Where Re[Zeff] is the real part of the impedance yielded by the transformation.

Thus, where an effective impedance MAG[Zeff] of 50 Ohms is desired, and source side impedance is equal to 6-j5, R is equal to 6.0 and X is equal to 5.0. By applying these values into the equation I, the value for R1 (i.e., negative resistor) can be determined. Specifically, the equation would appear as follows:

$$50 = \frac{[(R1(6) + 5^2)^2 + 5^2(6 - R1)^2]^{1/2}}{ABS[6 + R1]}$$

This yields an R1 value of approximately −7.4 Ohms for negative resistor 62.

Similarly, under equation II, the transformation yields a real part of approximately 13.8 Ohms as follows:

$$13.8 = \frac{6(-7.4) + 5^2}{6 + (-7.4)}$$

It should be appreciated that the values utilized are for illustrative purposes only, and that other values could be substituted. For example, a synthesized impedance other than 50 Ohms could be selected and the values for R and X may vary. The values of 50 Ohms, 6.0, and 5.0 are used herein only to illustrate the transformation.

Figure 4:
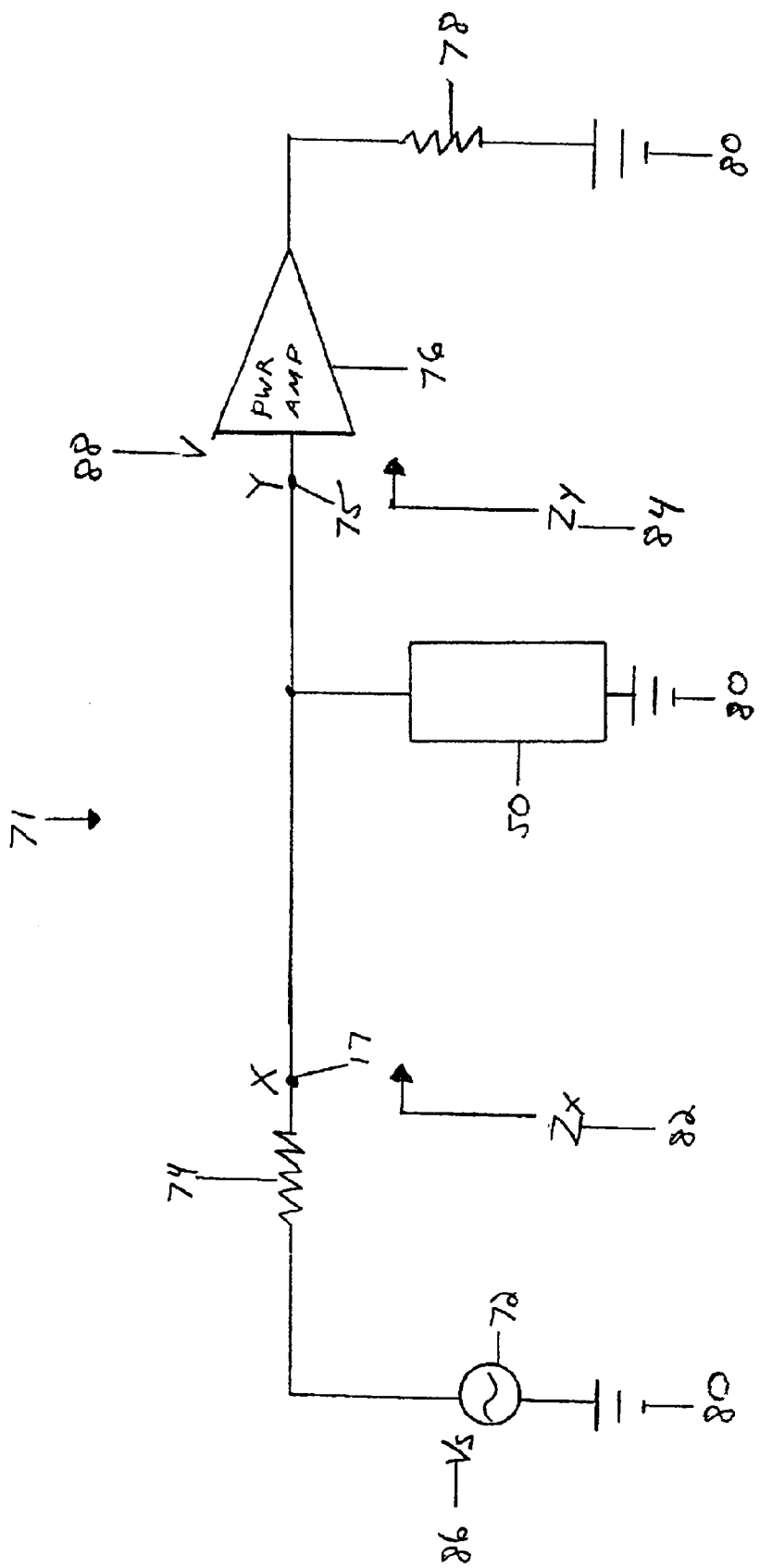
FIG. 4 depicts a circuit having the impedance transformer network of FIG. 3.

Referring now to FIG. 4, impedance transformer network 50 is shown in parallel with signal source 72 for circuit 71. Circuit 71 is preferably an RF circuit for an electronic device (e.g., audio, wireless communications, etc.). However, it should be understood that impedance transformer network 50 could be implemented in other circuit types. As depicted, circuit 71 comprises resistor 74, power amplifier 76, load resistor 78, and grounds 80. Impedance transformer network 50 will match impedances by synthesizing the source side impedance Zx 82 at the input (load) side Zy 84 (i.e., input 75 of power amplifier 76) in accordance with the equations illustrated above.

Figure 5:
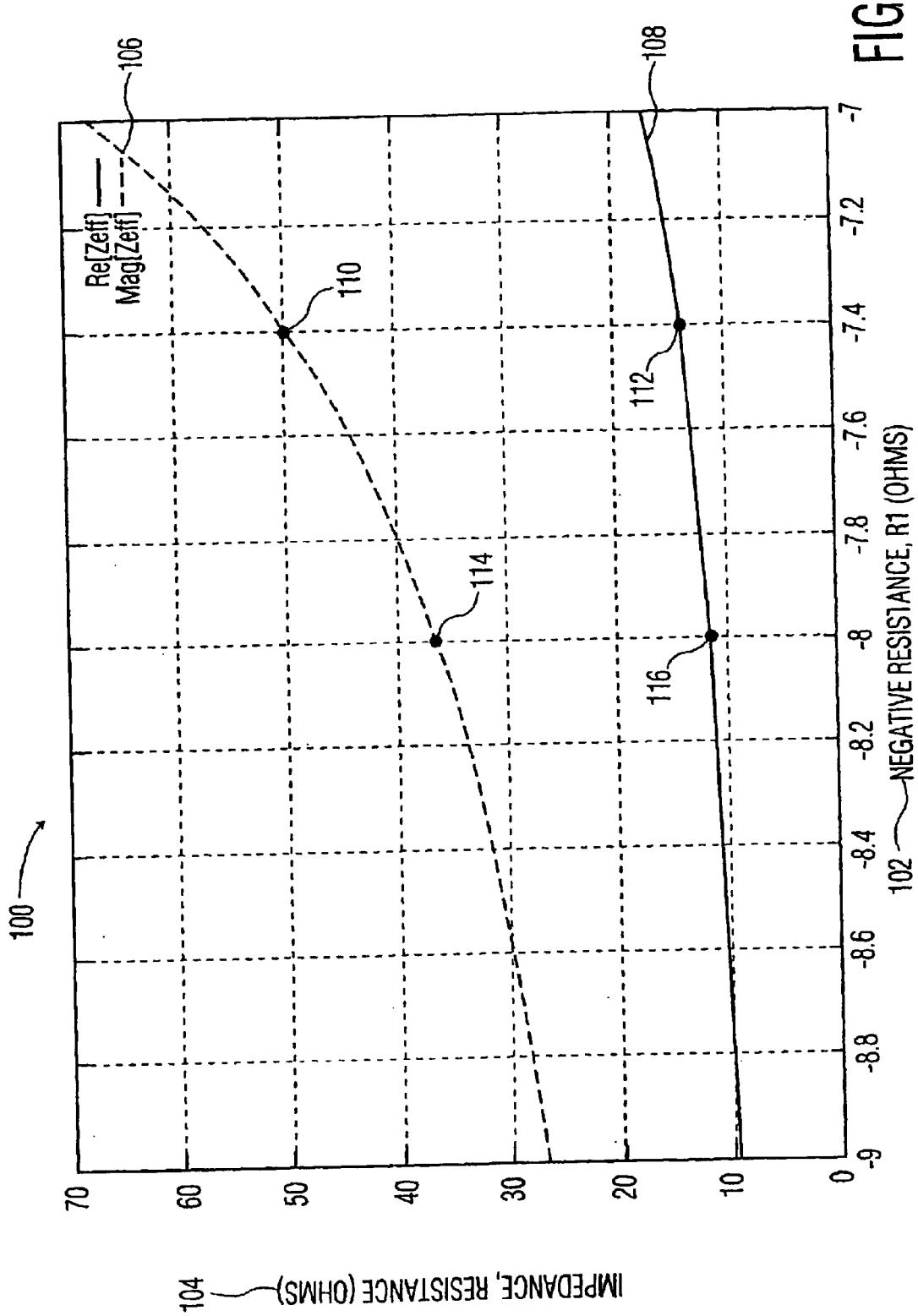
FIG. 5 depicts a graph of negative resistance versus impedance for a circuit in accordance with the present invention.

Referring now to FIG. 5, a graph 100 of Negative Resistance, R1 (in Ohms) 102 versus Impedance, Resistance (in Ohms) 104 is depicted. As shown, graph 100 includes a synthesized impedance (MAG[Zeff]) curve 106 and real part (Re[Zeff]) curve 108. The curves are compiled by applying the above values of 6.0 (R) and 5.0 (X) into above equations I and II, and then selecting values for R1. Thus, for example, by selecting a value for negative resistor 52 of −7.4 Ohms, it can be seen that a synthesized impedance of approximately 50 Ohms (point 110) and a real part of approximately 13.8 Ohms (point 112) is achieved. As indicated above, however, it should be appreciated that other values for R and X could have be selected. The precise values for R and X are dependent on the particular circuit in which impedance transformer network 50 is being implemented.

By selecting a different value for R1, the synthesized and real impedances will change. For example, by selecting the lower value of −8.0 Ohms for R1, a synthesized impedance of approximately 36.8 Ohms (point 114) and a real impedance of approximately 11.5 Ohms (point 116) are obtained. Thus, R1 is proportional to impedance. Specifically, by reducing the value of negative resistance, the corresponding values for synthesized and real impedance are also reduced.

In addition to synthesizing the source side impedance at the input side, the inductor transformation network of the present invention also increases the signal swing (i.e., the ratio of signal voltage at the input to signal voltage at the source). Specifically, by selecting a particular value for negative resistance R1, the corresponding phase of the negative resistance is also effected. By altering the phase in this manner, the signal swing can be manipulated. The phase is determined by the following equation:

III.

$$Phase[Zeff] = \Phi = \arctan\frac{X(R-R1)}{RR1+X^2}$$

Thus, for a negative resistance R1 value of −7.4 Ohms, an R value of 6.0, and an X value of 5.0, the equation would appear as follows:

$$Phase[Zeff] = \Phi = \arctan\frac{5(6+7.4)}{6(-7.4)+25}$$

This yields a phase of approximately −1.29 Radians. By normalizing this value to Pi, the phase is approximately −0.41 Radians. Using this value, the signal swing can be determined. Specifically, signal swing is obtained from the following equation:

IV.

$$Vi = \frac{Vs * Ze^{j\phi}}{(2+2\cos\Phi)^{1/2}}$$

By applying the above-obtained normalized phase Φ of −0.41 Radians, and then by solving equation IV for Vi/Vs, the signal swing can be determined. Specifically, the equation would appear as follows:

$$Vi/Vs = \frac{Ze^{j(-.41)}}{(2+2\cos(-.41))^{1/2}}$$

This yields a signal swing of 0.62. Under previous embodiments, such as those shown in FIG. 1, the signal swing was often less than 0.5.

Figure 6:
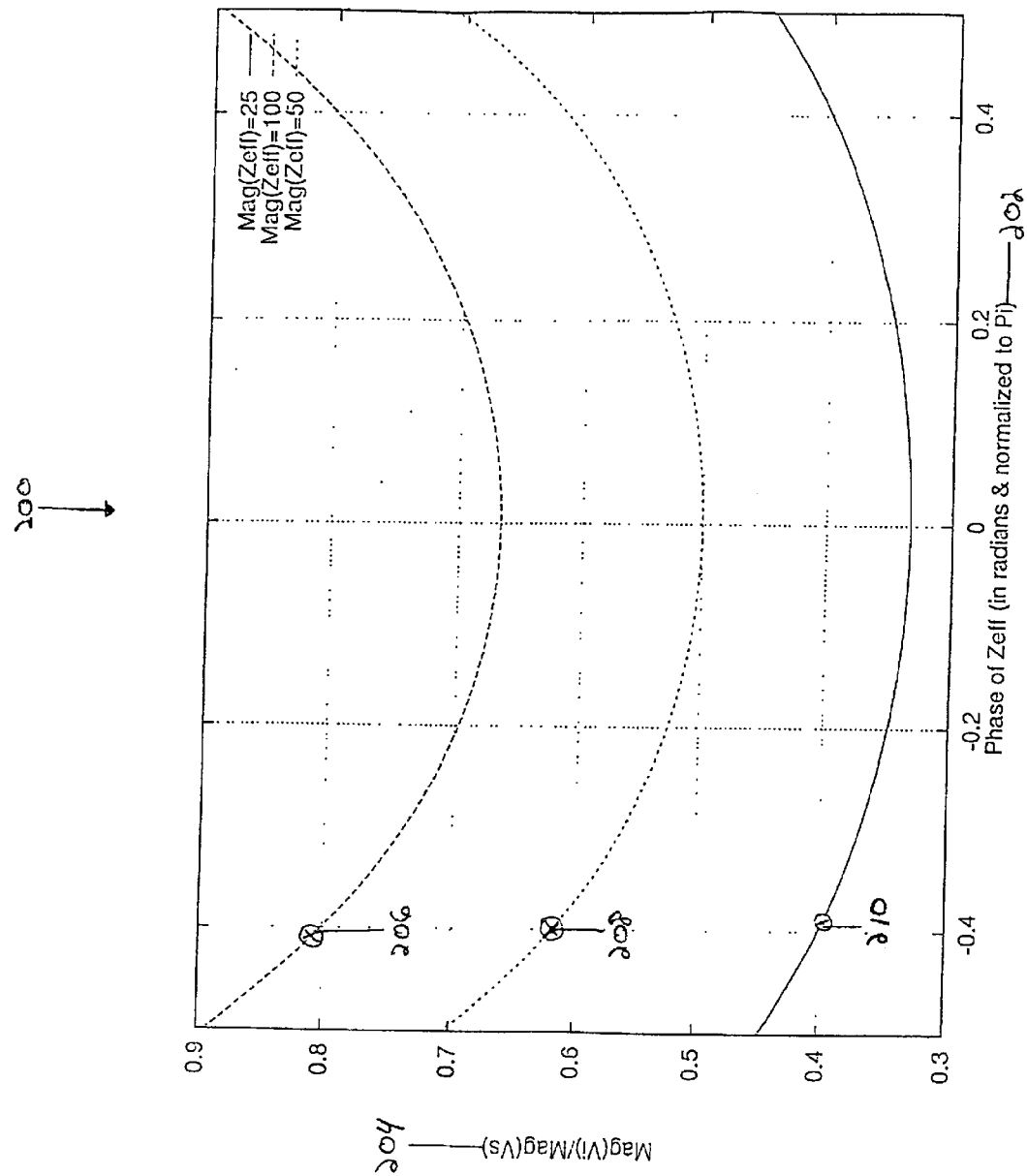
FIG. 6 depicts graph of phase of impedance versus signal swing for a circuit in accordance with the present invention.

FIG. 6 shows a graph 200 of Phase of Zeff (in Radians and normalized to Pi) 202 versus Mag(Vi)/Mag(Vs) 204 (i.e., signal swing). As indicated above, for a synthesized impedance of 50 Ohms, and a corresponding value of −7.4 Ohms for R1, the phase Φ was determined to be approximately −0.41 Radians (normalized to Pi). As shown on graph 200, this phase yields a corresponding signal swing of approximately 0.62 (point 208). Similarly, for a synthesized impedance of 100 Ohms, and a phase Φ of approximately −0.41 Radians, a signal swing of approximately 0.8 is obtained (point 206). Moreover, for a synthesized impedance of 25 Ohms, and the same phase Φ of approximately −0.41 Radians, the signal swing is approximately 0.4 (point 210).

As indicated above, R1 is proportional to synthesized impedance, but is inversely proportional to phase Φ. Specifically, as the value of R1 increases, the synthesized impedance increases while phase Φ decreases. For example, if R1 was selected to be −8.0 Ohms, synthesized impedance would be approximately 36.8 Ohms, while normalized phase Φ would be approximately −0.399 Radians. Conversely, if R1 was −7.4 Ohms, synthesized impedance would be approximately 50 Ohms, while the normalized phase Φ would be approximately −0.410 Radians. Thus, as the value of R1 increases, phase Φ will decrease, which causes the signal swing to increase (as shown in FIG. 6). Accordingly, if a higher impedance and signal swing is desired, a higher value of R1 should be selected. Preferably, the phase Φ should remain between −90° and 90° or −0.5 Radians to 0.5 Radians (as normalized to Pi).

Figure 7:
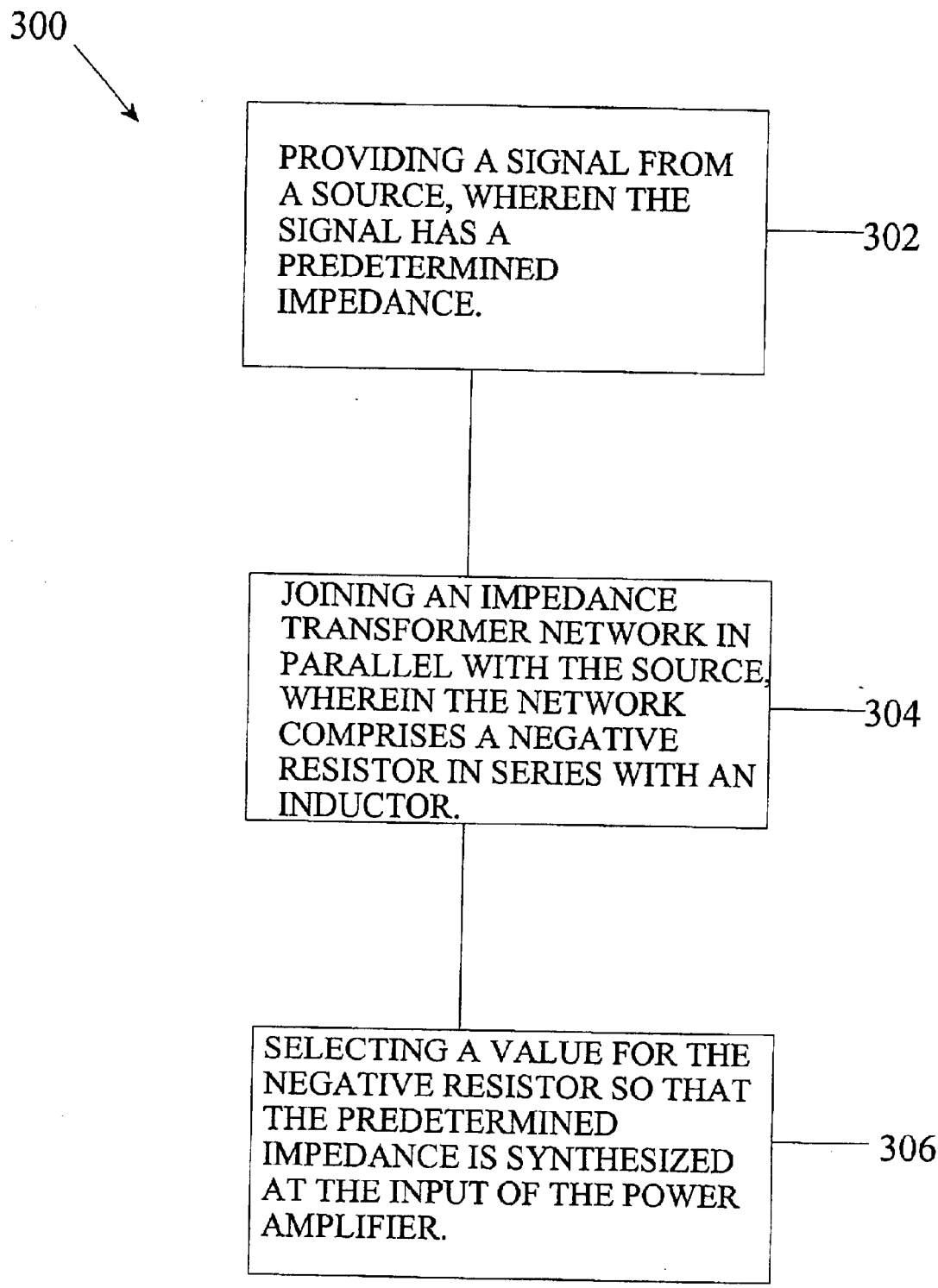
FIG. 7 depicts a method flow chart in accordance with the present invention.

Referring now to FIG. 7, a flow chart of a method 300 is shown. The first step 302 of method 300 is to provide a signal from a source, wherein the provided signal has a predetermined impedance. Second step 304 is to join an impedance transformer network in parallel with the source, wherein the network comprises a negative resistor in series with an inductor. The third step 306 of method 300 is to select a value for the negative resistor so that the predetermined impedance is synthesized at the input of the power amplifier.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A circuit for input side impedance matching of a power amplifier in an electronic device, comprising:
   a source for providing a signal, wherein the signal has a predetermined impedance; and
   an impedance transformer network
   wherein the predetermined impedance of the signal is synthesized at an input of the power amplifier solely by the impedance transformer network, and wherein the entire impedance transformer network is joined in parallel with the source, and comprises a negative resistor in series with an inductor.

2. The circuit of claim 1, wherein the inductor has a reactance equal to a capacitance of the device at a required frequency of operation.

3. The circuit of claim 1, wherein the inductor is a bondwire inductor.

4. The circuit of claim 1, wherein a value of the negative resistor is selected to synthesize the predetermined impedance at an input of the power amplifier.

5. The circuit of claim 4, wherein the value of the negative resistor is approximately −7.4 Ohms.

6. The circuit of claim 4, wherein the predetermined impedance is approximately 50 Ohms.

7. The circuit of claim 4, wherein a normalized phase of the synthesized impedance is between approximately −0.5 to 0.5 Radians.

8. The circuit of claim 7, wherein the normalized phase is approximately −0.4 Radians.

9. The circuit of claim 1, wherein a ratio of signal voltage at an input of the power amplifier to signal voltage at the source is approximately 0.62.

10. A circuit for input side impedance matching of a power amplifier in an electronic device, comprising:

a source for providing a signal, wherein the signal has a predetermined impedance;

an impedance transformer network solely by which the predetermined impedance at an input of the power amplifier is synthesized, said entire impedance transformer network being joined in parallel with the source and comprising a negative resistor in series with an inductor;

wherein a value of the negative resistor is selected to synthesize the predetermined impedance at an input of the power amplifier, and wherein the inductor has a reactance equal to a capacitance of the device at a required frequency of operation.

11. The circuit of claim 10, wherein the predetermined impedance is approximately 50 Ohms, and wherein the value of the negative resistor is approximately −7.4 Ohms.

12. The circuit of claim 11, wherein the synthesized impedance has a normalized phase between approximately −0.5 and 0.5 Radians.

13. The circuit of claim 12, wherein the normalized phase is approximately −0.41 Radians.

14. The circuit of claim 13, wherein a ratio of signal voltage at the input to signal voltage at the source is approximately 0.62.

15. A method for matching impedance at an input of a power amplifier in an electronic device, comprising the steps of:

providing a signal from a source, wherein the provided signal has a predetermined impedance;

joining an impedance transformer network, solely by which the predetermined impedance is synthesized at an input of the power amplifier, in parallel in its entirety with the source wherein the network comprises a negative resistor in series with an inductor; and selecting a value for the negative resistor so that the predetermined impedance is synthesized at the input of the power amplifier.

16. The method of claim 15, further comprising the step of setting a reactance of the inductor equal to a capacitance of the device at a required frequency of operation.

17. The method of claim 15, wherein the selecting step comprises selecting a value of −7.4 Ohms for the negative resistor.

18. The method of claim 15, wherein the predetermined impedance is approximately 50 Ohms.

19. The method of claim 15, wherein a normalized phase of the synthesized impedance is approximately −0.41 Radians.

20. The method of claim 15, wherein a ratio of signal voltage at the input to signal voltage at the source is approximately 0.62.

* * * * *